United States Patent [19]
van Gogh

[11] Patent Number: 6,023,038
[45] Date of Patent: Feb. 8, 2000

[54] RESISTIVE HEATING OF POWERED COIL TO REDUCE TRANSIENT HEATING/START UP EFFECTS MULTIPLE LOADLOCK SYSTEM

[75] Inventor: James van Gogh, Sunnyvale, Calif.

[73] Assignee: Applied Materials, Inc., Santa Clara, Calif.

[21] Appl. No.: 08/931,170

[22] Filed: Sep. 16, 1997

[51] Int. Cl.[7] .............................. B23K 10/00; H05H 1/46
[52] U.S. Cl. ................................ 219/121.43; 219/121.44; 219/121.54; 219/494; 118/723 I; 427/38; 156/345; 156/646.1
[58] Field of Search .............................. 219/121.52, 497, 219/494, 121.43, 121.4, 121.41; 118/723 I; 427/38, 250, 256; 204/192.21, 192.81; 156/345, 643.1, 646.1

[56] References Cited

U.S. PATENT DOCUMENTS

| | | |
|---|---|---|
| 3,594,295 | 7/1971 | Meckel et al. |
| 3,675,093 | 7/1972 | Russo et al. |
| 4,284,490 | 8/1981 | Weber . |
| 4,336,118 | 6/1982 | Patten et al. |
| 4,362,632 | 12/1982 | Jacob . |
| 4,441,092 | 4/1984 | Thornton et al. |
| 4,495,221 | 1/1985 | Broadbent . |
| 4,626,312 | 12/1986 | Tracy . |

(List continued on next page.)

FOREIGN PATENT DOCUMENTS

| | | |
|---|---|---|
| 0520519 | 12/1992 | European Pat. Off. . |
| 0607797 | 1/1994 | European Pat. Off. . |
| 0782172 | 11/1996 | European Pat. Off. . |
| 0774886 | 5/1997 | European Pat. Off. . |
| 0807954 | 5/1997 | European Pat. Off. . |
| 0791663 | 8/1997 | European Pat. Off. . |
| 0836219 | 10/1997 | European Pat. Off. . |
| 0836219 | 4/1998 | European Pat. Off. . |
| 56-102907 | 6/1981 | Japan . |
| 58-19363 | 4/1983 | Japan . |
| 59-190363 | 10/1984 | Japan . |
| 60-254720 | 11/1985 | Japan . |
| 61-190070 | 8/1986 | Japan . |
| 5152248 | 1/1991 | Japan . |
| 5-129276 | 5/1993 | Japan . |
| 6232055 | 8/1994 | Japan . |
| 6283470 | 10/1994 | Japan . |
| 7176398 | 7/1995 | Japan . |
| 7176399 | 7/1995 | Japan . |
| 8153712 | 6/1996 | Japan . |
| 8288259 | 11/1996 | Japan . |
| 2162365 | 1/1986 | United Kingdom . |
| 2231197 | 11/1990 | United Kingdom . |
| WO860623 | 11/1986 | WIPO . |
| 9207969 | 5/1992 | WIPO . |
| 9214258 | 8/1992 | WIPO . |

OTHER PUBLICATIONS

PCT Search Report in Application No. PCT/US98/19165.
Declaration of James Van Gogh.
Demaray et al., "Aluminum Alloy Planarization for Topography Control of Multilevel VLSI Interconnect," Proceedings—VLSI and Computers: First International Conference on Computer Technology, Systems and Applications, May 11, 1987.

(List continued on next page.)

*Primary Examiner*—Mark Paschall
*Attorney, Agent, or Firm*—Konrad Raynes & Victor

[57] ABSTRACT

A method and apparatus for pre-heating a coil used to generate a plasma field in a processing chamber in a semiconductor fabrication system. The coil is pre-heated in the chamber prior to sputter depositing material onto a substrate and workpiece. The coil is pre-heated to a predetermined temperature, which is preferably equal to or greater than the equilibrium temperature attained by the coil during sputter deposition processes. Pre-heating may be effected with a preheating current having a frequency lower than the minimum frequency required to ignite a plasma, or when the processing chamber contains an atmosphere which prevents formation of a plasma. The coil may pre-heated for a predetermined time period.

43 Claims, 3 Drawing Sheets

U.S. PATENT DOCUMENTS

| | | |
|---|---|---|
| 4,661,228 | 4/1987 | Mintz . |
| 4,692,230 | 9/1987 | Nihei et al. . |
| 4,716,491 | 12/1987 | Ohno et al. . |
| 4,717,462 | 1/1988 | Homma et al. . |
| 4,756,815 | 7/1988 | Turner et al. . |
| 4,792,732 | 12/1988 | O'Loughlin . |
| 4,810,342 | 3/1989 | Inoue . |
| 4,816,126 | 3/1989 | Kamoshida et al. . |
| 4,818,723 | 4/1989 | Yen . |
| 4,824,544 | 4/1989 | Mikalesen et al. . |
| 4,842,703 | 6/1989 | Class et al. . |
| 4,844,775 | 7/1989 | Keeble . |
| 4,865,712 | 9/1989 | Mintz . |
| 4,871,421 | 10/1989 | Ogle et al. . |
| 4,897,709 | 1/1990 | Yokoyama et al. . |
| 4,918,031 | 4/1990 | Flamm et al. . |
| 4,925,542 | 5/1990 | Kidd . |
| 4,941,915 | 7/1990 | Matsuoka et al. . |
| 4,944,961 | 7/1990 | Lu et al. . |
| 4,948,458 | 8/1990 | Ogle . |
| 4,970,176 | 11/1990 | Tracy et al. . |
| 4,990,229 | 2/1991 | Campbell et al. . |
| 4,999,096 | 3/1991 | Nihei et al. . |
| 5,065,698 | 11/1991 | Koike . |
| 5,091,049 | 2/1992 | Campbell et al. . |
| 5,094,885 | 3/1992 | Selbrede . |
| 5,102,371 | 4/1992 | Shuto et al. . |
| 5,122,251 | 6/1992 | Campbell et al. . |
| 5,135,629 | 8/1992 | Sawada et al. . |
| 5,146,137 | 9/1992 | Gesche et al. . |
| 5,169,684 | 12/1992 | Takagi . |
| 5,171,412 | 12/1992 | Talieh et al. . |
| 5,175,608 | 12/1992 | Nihei et al. . |
| 5,178,739 | 1/1993 | Barnes et al. . |
| 5,186,718 | 2/1993 | Tepman et al. . |
| 5,195,045 | 3/1993 | Keane et al. . |
| 5,206,516 | 4/1993 | Keller at al. . |
| 5,213,650 | 5/1993 | Wang et al. . |
| 5,223,112 | 6/1993 | Tepman . |
| 5,225,740 | 7/1993 | Ohkawa . |
| 5,228,501 | 7/1993 | Tepman . |
| 5,231,334 | 7/1993 | Paranjpe . |
| 5,234,560 | 8/1993 | Kadlec et al. . |
| 5,238,499 | 8/1993 | van de Ven et al. . |
| 5,241,245 | 8/1993 | Barnes et al. . |
| 5,280,154 | 1/1994 | Cuomo et al. . |
| 5,292,393 | 3/1994 | Maydan et al. . |
| 5,304,279 | 4/1994 | Coultas et al. . |
| 5,312,717 | 5/1994 | Sachdev et al. . |
| 5,320,728 | 6/1994 | Tepman . |
| 5,346,578 | 9/1994 | Benzing et al. . |
| 5,360,996 | 11/1994 | Nulman et al. . |
| 5,361,016 | 11/1994 | Ohkawa et al. . |
| 5,366,590 | 11/1994 | Kadomura . |
| 5,368,685 | 11/1994 | Kumihashi et al. . |
| 5,392,018 | 2/1995 | Collins et al. . |
| 5,397,962 | 3/1995 | Moslehi . |
| 5,404,079 | 4/1995 | Ohkuni et al. . |
| 5,418,431 | 5/1995 | Williamson et al. . |
| 5,421,891 | 6/1995 | Campbell et al. . |
| 5,424,691 | 6/1995 | Sadinsky . |
| 5,427,668 | 6/1995 | Sato et al. . |
| 5,429,070 | 7/1995 | Campbell et al. . |
| 5,429,710 | 7/1995 | Akiba et al. . |
| 5,429,995 | 7/1995 | Nishiyama et al. . |
| 5,430,355 | 7/1995 | Paranjpe . |
| 5,431,799 | 7/1995 | Mosley et al. . |
| 5,441,596 | 8/1995 | Nulty . |
| 5,503,676 | 4/1996 | Shufflebotham et al. . |
| 5,573,595 | 11/1996 | Dible . |
| 5,585,766 | 12/1996 | Shel . |
| 5,639,357 | 6/1997 | Xu . |
| 5,680,014 | 10/1997 | Miyamoto et al. ................ 315/111.41 |
| 5,689,215 | 11/1997 | Richardson et al. . |
| 5,707,498 | 1/1998 | Ngan . |
| 5,759,280 | 6/1998 | Holland et al. . |
| 5,793,162 | 8/1998 | Barnes et al. ...................... 315/111.51 |

OTHER PUBLICATIONS

Park et al., "Influences of D.C. Bias on Aluminum Films Prepared with a High Rate Magnetron Sputtering Cathode," Thin Solid Films, 1985.

Hoffman, "Practical Troubleshooting of Vacuum Deposition Processes and Equipment for Aluminum Metallization," Solid State Technology, vol. 21, No. 12, pp. 47–56, Dec. 12, 1978.

Hoffman, "Tungsten Titanium Diffusion Barrier Metallization," Solid State Technology, vol. 26, No. 6, pp. 119–126, Jun. 6, 1983.

Hoffman et al., "Planarization of Aluminum Alloy Films During High Rate Sputtering," Thin Solid Films, vol. 153, pp. 369–377, Oct. 26, 1987.

Ahn et al., Effects of Substrate Temperature on Copper Distribution, Resistivity, and Microstructure in Magnetron–Sputtered Al–Cu Films, Thin Solid Films, vol. 153, pp. 409–419, Oct. 26, 1987.

Helmer et al., "Pressure Effects in Planar Magnetron Sputter Deposition," Journal of Vacuum Science & Technology A (Vacuum, Surfaces, and Films), vol. 4, No. 3, pt. 1, pp. 408–412, May–Jun., 1986.

Skelly et al., "Significant Improvement in Step Coverage Using Bias Sputter Aluminum," J. Vac. Sci. Technol., 1986.

Joshi et al., Collimated Sputtering of TiN/Ti Liners into Sub–Half Micron High Aspect Ratio Contacts/Lines, Jun. 9–10, 1992 VMIC Conference 1992, pp 253–259.

Meikle et al., "Semiconductor Process Considerations for Collimated Source Sputtering of Ti Films," Jun. 9–10, 1992 VMIC Conference, 1992, pp. 289–291.

Van Gogh et al., "Characterization of Improved TiN Films by Controlled Divergence Sputtering," Jun. 9–10, 1992 VMIC Conference, 1992, pp. 310–313.

M. Yamashita, "Sputter Type High Frequency Ion Source for Ion Beam Deposition Apparatus," Jap. J. Appl. Phys., vol. 26, pp. 721–727, 1987.

M. Yamashita, "Fundamental Characterisitics of Built–in High Frequency Coil Type Sputtering Apparatus," J. Vac. Sci. Technol., vol. A7, pp. 151–158, 1989.

S.M. Rossnagel et al., "Metal Ion Deposition from Ionized Magnetron Sputtering Discharge," J. Vac. Sci. Technol., vol. B12, pp. 449–453, 1994.

S.M. Rossnagel et al., "Magnetron Sputter Deposition with High Levels of Metal Ionization," Appl. Phys. Lett., vol. 63, pp. 3285–3287, 1993.

S.M. Rossnagel, et al., "Filling Dual Damascene Interconnect Structures with AlCu and Cu Using Ionized Magnetron Deposition," J. Vac. Sci. Technol., vol. B13, pp. 125–129, 1995.

Y–W. Kim et al., "Ionized Sputter Deposition of AlCu: Film Microstructure and Chemistry," J. Vac. Sci. Technol., vol. A12, pp. 3169–3175, 1994.-

J. Hopwood et al., "Mechanisms for Highly Ionized Magnetron Sputtering," *J. Appl. Phys.*, vol. 78, pp.758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

Singapore Search Report in Application No. 9704107–3 filed Nov. 20, 1997.

RESISTIVE HEATING OF POWERED COIL TO REDUCE TRANSIENT HEATING/START UP EFFECTS MULTIPLE LOADLOCK SYSTEM

BACKGROUND OF THE INVENTION

The present invention relates to apparatus and methods for processing semiconductor wafers or other semiconductor workpieces, in a chamber containing a plasma created to ionize a deposition material or etch a workpiece.

Certain semiconductor device fabrication procedures include processes in which a material is sputtered from a target onto a workpiece, such as a semiconductor wafer or a group of semiconductor wafers, in the presence of a plasma that ionizes the sputtered material. Material is sputtered from the target, which is appropriately biased, by the impact of ions created in the vicinity of the target.

The workpiece is mounted on a support and may be biased to a potential selected to attract the sputtered, ionized material to the workpiece. Typically, the sputtered material once ionized, is composed of positive ions and the workpiece is negatively biased.

There are several known techniques for exciting a plasma with RF fields including capacitive coupling, inductive coupling and wave heating. In a standard inductively coupled plasma (ICP) generator, RF current passing through a coil which is located within the chamber induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

As described in copending application Ser. No. 08/680, 335, entitled "Coils for Generating a Plasma and for Sputtering," filed Jul. 10, 1996 (Attorney Docket # 1390CIP/PVD/DV) and assigned to the assignee of the present application, which application is incorporated herein by reference in its entirety, it has been recognized that the coil itself may provide a source of sputtered material to supplement the deposition material sputtered from the primary target of the chamber. Application of an RF signal to a coil coupled to a blocking capacitor can cause the coil to develop a negative bias which will attract positive ions that can impact the coil, causing material to be sputtered from the coil. Because the material sputtered from the coil tends to deposit more thickly at the periphery of the workpiece area, the center thick tendency for material sputtered from the primary target can be compensated by the edge thick tendency for material sputtered from the coil As a result, uniformity can be improved.

One problem encountered in the operation of apparatus of the type described above is that variations occur in the manner in which the sputtered material is deposited on the workpiece during operation of the apparatus over a period immediately following startup of the apparatus. As a result, processing of the first several workpieces may not be satisfactory, even though sputtering material has been consumed, as has a portion of the operating life of the apparatus.

BRIEF SUMMARY OF THE INVENTION

It is an object of the present invention to ameliorate this problem.

A more specific object of the invention is to assure satisfactory processing of all workpieces following startup of such apparatus without unnecessary loss of valuable wafers, consumption of sputtering material and without shortening the useful life of the apparatus.

It has been recognized by the present applicant that the unsatisfactory processing of workpieces during performance of procedures of the type described above immediately following startup of the processing apparatus is due in significant measure to variations in the operating characteristics of the coil as it heats up from ambient temperature, i.e., the temperature of the coil prior to startup of the apparatus, to its stable operating, or equilibrium, temperature. Specifically, it has been found that the relatively slow temperature ramp of the coil to its equilibrium temperature at the initiation of a sputtering process, such as a deposition process, causes the coil to radiate a nonuniform level of heat energy as the coil temperature rises, resulting in variations in the deposition properties for those workpieces sputtered during the temperature ramp-up of the coil.

The above-described problem is addressed, and the above and other objects of the invention are achieved, by resistively heating an RF coil disposed within a vacuum chamber between a target and substrate support to a target temperature which is preferably at least its equilibrium temperature, while preventing any sputtering from occurring in the chamber. After the coil has been thus heated, sputter deposition can be initiated for a first workpiece placed in the vacuum chamber.

In preferred embodiments, a DC power source may be used to apply current to the coil to heat the coil to at least its equilibrium temperature. The duration of the resistive heating operation can be determined by preliminary measurement of the time required for the coil to reach its equilibrium temperature in the vacuum chamber. Then, at the time of startup of the apparatus for performing a sputtering operation, the coil may be resistively heated for this measured period of time.

Alternatively, according to a further novel feature of the invention, the coil may be resistively heated by a suitable heating current until it reaches a temperature at which it begins to radiate a substantial amount of infrared energy. At this coil temperature, it is believed that the equilibrium will be reached in which the emitted radiation will automatically balance the resistive heating energy supplied to the coil so that its temperature will remain constant at a value somewhat above the above-mentioned equilibrium temperature associated with the sputtering procedure. If the resistive heating current is than replaced by the RF current which to be employed for inductively coupled plasma generation, the coil can cool relatively quickly to the sputtering equilibrium temperature.

In accordance with the invention, sputtering is preferably prevented from occurring in the chamber during startup heating of the coil by preventing a plasma from being created until the coil has reached its equilibrium temperature, or possibly its radiation temperature. Plasma creation may be prevented by effecting the resistive heating with either a DC current or an ac current at a frequency below that which will ignite a plasma, or by maintaining the atmosphere in the chamber at a sufficiently low pressure, of the order of milliTorrs, to prevent plasma ignition regardless of the magnitude and frequency of the heating current applied to the coil.

Accordingly, by pre-heating the coil to at least its equilibrium temperature according to the present invention, variations in the results of the sputtering process are alleviated.

DETAILED DESCRIPTION OF THE INVENTION

Figure 1:
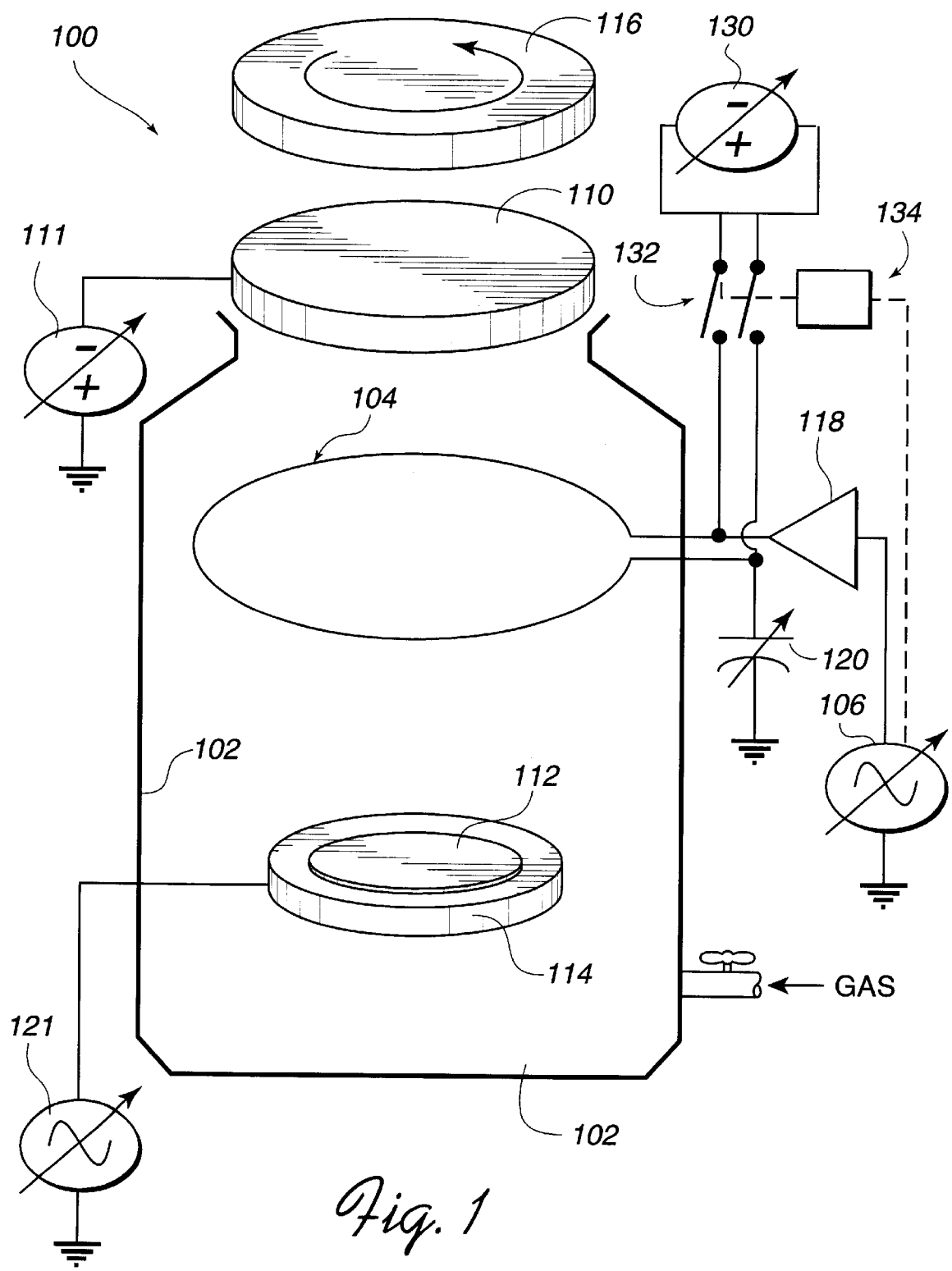
FIG. 1 is a schematic diagram of a preferred embodiment of apparatus for implementing the present invention.
Figure 2:
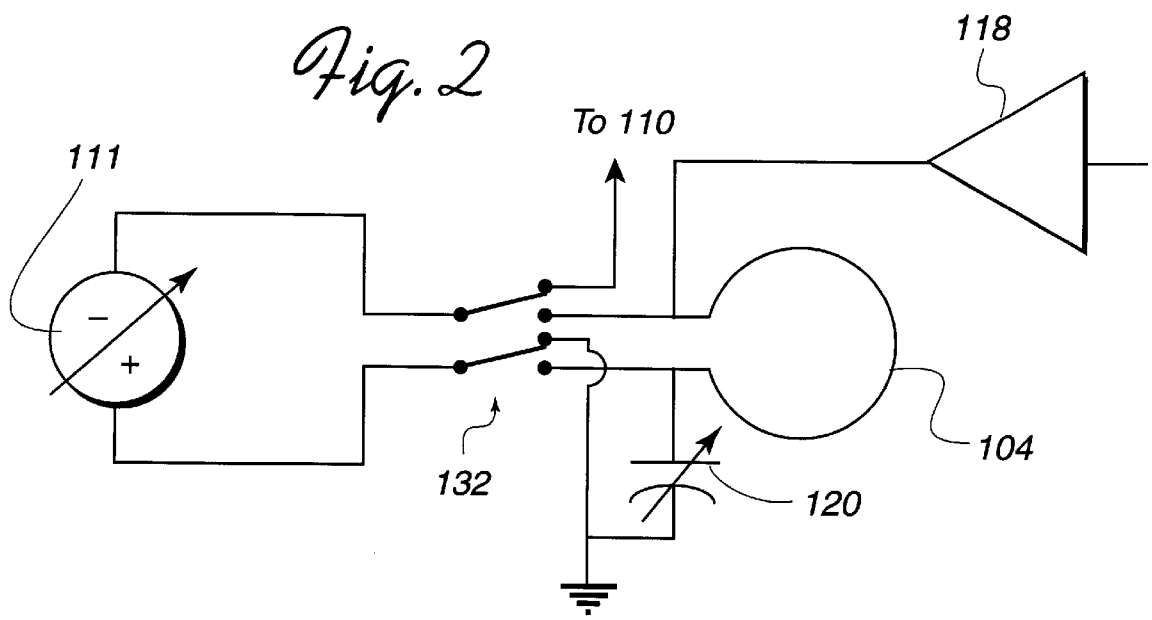
FIG. 2 is a circuit diagram of a part of a modified form of construction of the embodiment of FIG. 1.

Referring to FIGS. 1 and 2, an example of a plasma generator 100 to which the invention may be applied comprises a substantially cylindrical plasma chamber 102 in which a suitable vacuum can be established. The plasma chamber 102 of this embodiment contains a one-turn or multiple-turn RF coil 104. Radio frequency (RF) energy from an RF current generator 106 is radiated from the RF coil 104 into the interior of chamber 102 to ignite and maintain a plasma therein when an ionizable gas is present at a sufficient pressure in chamber 102. The RF generator 106 is preferably coupled to the coil 104 through an amplifier and impedance matching network 118. The other end of RF coil 104 is coupled to ground, preferably through a capacitor 120 which may be a variable capacitor.

A rotating magnet assembly 116 provided above a sputtering target 110 produces magnetic fields which sweep over the face of the target 110 to generate ions adjacent target 110 and to promote uniform erosion of the target. The target 110 is negatively biased by a DC power source 111. The magnetic fields of the magnet 116 produce an ion flux which strikes the negatively biased target 110 positioned at the top of the chamber 102. The ions produced by the magnet assembly 116 eject, or sputter, material from the target 110 onto a substrate, or workpiece 112, which may be one or more semiconductor wafers or other workpieces and which is supported by a substrate support 114 at the bottom of the chamber 102. In alternative embodiments, the coil 104 may also be a supplementary source of material which is sputtered onto the substrate 112.

The substrate support 114 may be negatively biased by an AC (or RF or DC) source 121 so as to externally bias the substrate 112. Alternatively, external biasing of the substrate 112 may optionally be eliminated.

The atoms of material ejected from the target 110, and possibly also from coil 104, are in turn ionized by the plasma being energized by the RF coil 104 which is inductively coupled to the plasma. The ionized deposition material is attracted to the substrate 112 and forms a deposition layer thereon.

The copending application, entitled "Coils for Generating a Plasma and for Sputtering," supra, describes how a coil which sputters material onto the substrate may be positioned and disposed within a vacuum chamber to improve uniformity of deposition, and describes additional details about the vacuum chamber, RF generator, plasma field, etc.

FIG. 1 shows one preferred embodiment of circuitry for pre-heating the coil 104 prior to deposition processes. During pre-heating, a workpiece 112 may or may not be provided on the substrate 114. In either event, it is preferred that no plasma be produced, and hence no sputtering occur, during pre-heating. Coil 104 is resistively pre-heated by a pre-heating current from a power source 130, which is shown as a DC power source. Source 130 is connected to the ends of coil 104 by a double pole switch 132. Closing and opening of switch 132 may be controlled by a timer 134. During pre-heating, switch 132 is closed to couple power from power source 130 to the coil 104.

According to one embodiment of the invention, prior to performing deposition, etching or other processes, for each given coil 104, a determination will be made of the time required for such coil 104 to reach its equilibrium temperature when the coil is being heated by power from source 130, referred to herein as the "predetermined pre-heating time." Timer 134 can then be programmed with the predetermined pre-heating time. After heating current has been applied to the coil 104 for the predetermined pre-heating time, the timer 134 opens switch 132 and may, at the same time, activate RF source 106, as well as sources 111 and 121.

In alternative embodiments, there may be no timer. Instead, the operator may open switch 132 after having determined that DC current has been applied to the coil 104 for a sufficient pre-heating time.

As an alternative to the arrangement shown in FIG. 1, power source 30 may be omitted and either one of sources 111 and 121 can be connected to switch 132 in place of source 130. During pre-heating, the selected one of sources 111 and 121 would be connected in the manner shown in FIG. 1 for source 130. This arrangement would be appropriate if the source 111 or 121 has the capability of supplying the required pre-heating current. In this case, when switch 132 is opened, the source employed for pre-heating would still be connected to supply a bias voltage to its associated component.

According to a further alternative, illustrated in FIG. 2, either source 111, as shown, or source 121 can be connected to the fixed contacts of switch 132, while coil 104 is connected to one set of switchable contacts of switch 132. Target 110, as shown, or workpiece support 114, and ground are connected to the other set of switchable contacts of switch 132. With this arrangement, a biasing voltage will not be supplied to target 110, or to workpiece support 114, until the pre-heating phase has been completed.

FIGS. 1 and 2 illustrate embodiments in which resistive heating is effected by supplying a direct current to coil 104. In this case, chamber 102 can already contain an ionizable gas, such as argon, at a pressure sufficient to permit ignition of a plasma. However, a plasma will not be ignited as long as coil 104 is being supplied with a direct current. Alternatively, pre-heating can be effected by supplying an alternating resistive heating current to coil 104. If chamber 102 then contains an ionizable gas at a sufficient pressure to permit a plasma to be ignited, then the frequency of the alternating pre-heating current should be made less than that which is required to achieve such plasma ignition. In one type of chamber at a pressure of 10 mTorr or lower, a plasma will not be struck or maintained at a frequency below approximately 2 MHz. This minimum frequency will vary depending upon the chamber pressure and the geometry of the particular coil and chamber.

If, on the other hand, the gas pressure within chamber 102 is sufficiently low that a plasma could not be ignited even if a current of relatively high frequency were applied to coil 104, then the pre-heating current can have any arbitrarily selected frequency and can be at the plasma ignition frequency. As noted above, for many applications, a pressure of 10 mTorr or greater is often needed to permit striking or maintaining a plasma. Here again, the minimum chamber pressure will vary depending upon other chamber conditions and characteristics.

Figure 3:
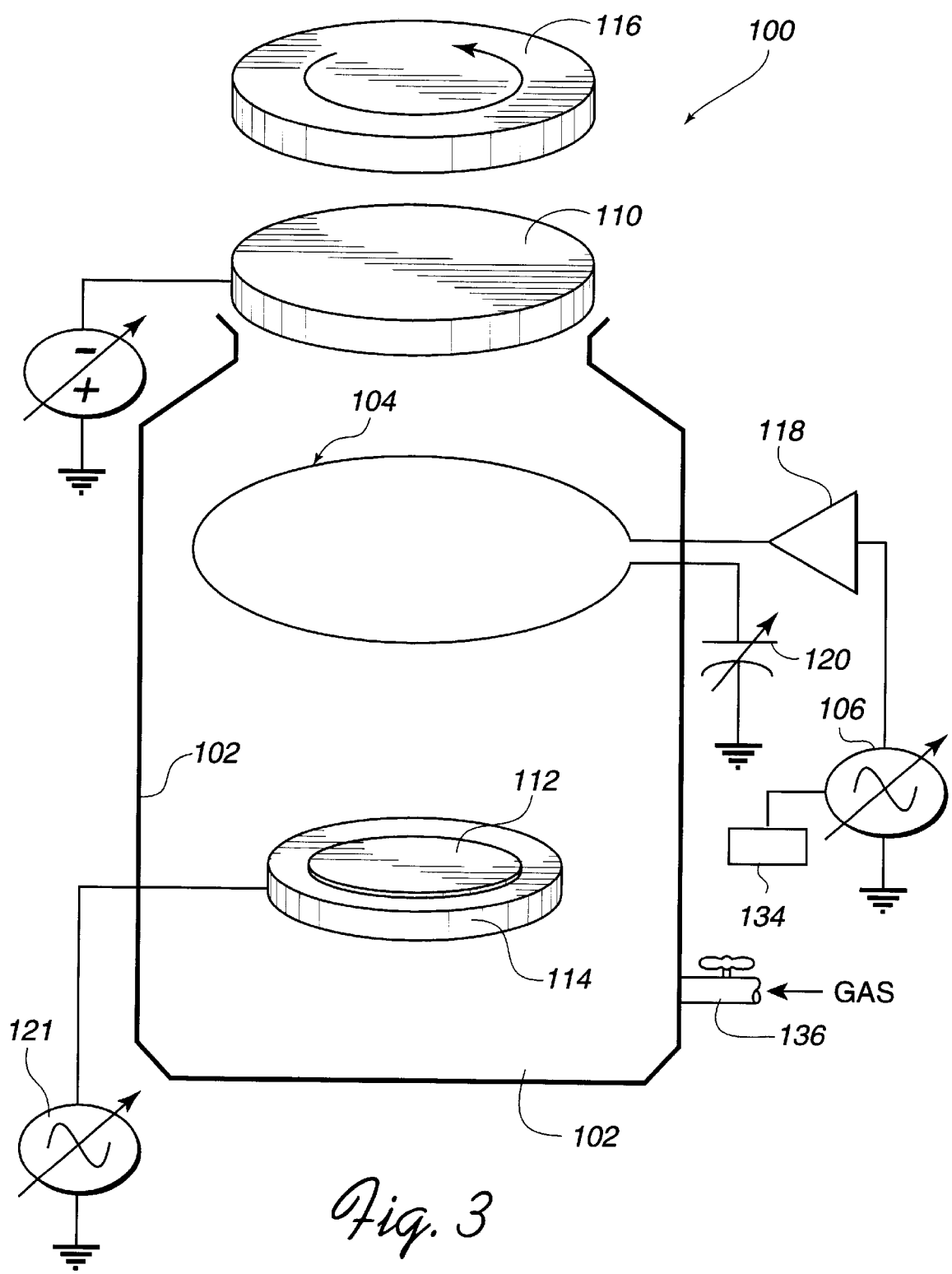
FIG. 3 is a schematic diagram of a second embodiment of apparatus for implementing the present invention.

FIG. 3 illustrates such an embodiment in which the coil 104 is pre-heated from the RF power source 106 which also serves to subsequently apply RF current to the coil 104 during sputter deposition processes to energize a plasma field. In FIG. 3, timer 134 is coupled to the RF power source 106. The timer 134 is activated when power source 106 is turned on and is programmed to generate a signal upon completion of the predetermined pre-heating time. This signal informs the operator that plasma generation and workpiece processing can proceed. In response to this signal, the necessary quantity of ionizable gas required to generate a plasma will be introduced into chamber 102.

As noted earlier herein, generation of a plasma requires that the chamber contain a suitable gas at a sufficiently high pressure and that coil 104 be supplied with power at a sufficiently high frequency. In the case of the embodiment shown in FIG. 3, pre-heating is effected by supplying coil 104 with RF power at such sufficiently high frequency. Therefore, when pre-heating is performed by the apparatus illustrated in FIG. 3, the pressure in chamber 102 is kept sufficiently low to prevent plasma ignition even in the presence of the RF field being produced by coil 104. At the completion of pre-heating, indicated by the above-noted signal, the operator will perform the conventional operations necessary to raise the gas pressure in chamber 102 through a valved inlet 136 to a level sufficient to permit plasma ignition.

In alternative embodiments, the operator can apply the RF current to the coil 104 during pre-heating processes and after a certain period of time, stop applying RF current. The operator will then position the workpiece 112 on the substrate 114 to begin sputter deposition processes.

Figure 4:
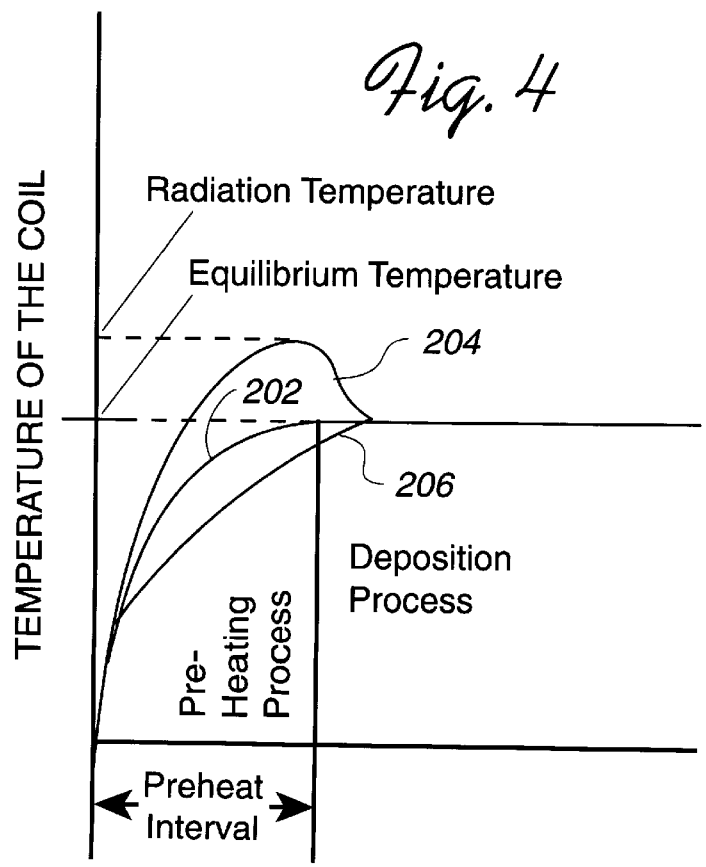
FIG. 4 is a graph illustrating variation in coil temperature vs. time during the course of heating operations according to the invention.

FIG. 4 provides a chart showing the course of three pre-heating processes according to the invention. According to the first of these processes, described above with reference to FIGS. 1–3 and represented by curve 202, the coil 104 is pre-heated during the pre-heat interval to the predetermined equilibrium temperature under conditions which assure that a plasma can not be ignited. After the pre-heat interval, a workpiece is placed on the substrate, the conditions necessary to ignite a plasma are established and the sputter deposition process begins. In typical situations, the coil does not have to be reheated separately for each workpiece because sputtering of material onto the next workpiece is initiated before the coil can cool substantially.

According to a second pre-heating process according to the invention, represented by curve 204, the resistive heating current supplied to coil 104 has a sufficient intensity to heat coil 104 to a target temperature at which it will begin substantial radiating. This target temperature is above the equilibrium temperature.

Attainment of the radiation temperature can be verified simply by visual observation of the coil, which will glow when it is radiating, or on the basis of preliminary measurements to determine the time necessary, at the selected resistive heating current, for the coil to be heated to its radiation temperature.

After coil 104 has reached its radiation temperature, the pre-heating current will be replaced by an RF current at the power level required to ignite the desired plasma, at which time the temperature of coil 104 will rapidly decrease to the equilibrium temperature.

In a third embodiment, as represented by curve 206, the coil may be pre-heated to a target temperature which is below that of the process equilibrium temperature. In this arrangement, the coil would be heated up the remaining amount to the process temperature once the deposition process began.

If the pre-heating process represented by either one of curves 202, 204 or 206 is performed by supplying the coil with RF power at a frequency sufficient to permit plasma ignition, then this process is preferably performed while the pressure in chamber 102 is sufficiently low to prevent plasma ignition.

Thus, by bringing the coil to its equilibrium temperature (or at least to a target temperature which is preferably near the equilibrium temperature) under conditions which prevent the ignition of a plasma, it is possible to avoid unnecessary consumption of sputtering material and shortening of the useful life of the apparatus, or at least shortening of the time between maintenance operations, and to avoid the processing of workpieces which would then have to be rejected.

The invention is applicable to any apparatus and method in which the plasma generating coil is disposed within the processing chamber and in which the inductively coupled plasma serves to ionize deposition material from a source for delivery to a workpiece or to etch a workpiece directly. Such processes include deposition processes, such as physical vapor deposition, and etching processes, such as reactive ion etching, inter alia.

It would also be possible, in the practice of the present invention, to employ a temperature detector within chamber 102 to determine when coil 104 has reached its target temperature. However, in many processing operations of the type contemplated by the present invention, such a detector would be exposed to the plasma produced during workpiece processing, so that its temperature sensing surfaces would be either coated or eroded. Therefore, if a temperature detector is employed, it should be of a type which would not be adversely affected by the conditions within such a processing chamber could be employed. For example, a temperature sensor could be built into coil 104 although, in the present state of the art, this would represent an increase in the structural complexity and manufacturing cost of the coil, which would probably be unwarranted since the conditions necessary to bring the coil to its equilibrium temperature or its radiation temperature can be determined in a relatively simple manner.

However, a temperature detector can be mounted on a coil during preliminary testing operations performed to determine the time required for the coil to reach its target temperature when a particular pre-heating current is being applied. If the same or similar coil is to be subsequently employed for generating a plasma, the temperature detector would preferably be removed after the necessary test measurements have been obtained.

The time interval needed to heat the coil will vary depending upon the current level of the current source and the resistance of the coil. For many applications, it is anticipated that the time interval may range from 3 to 7 minutes, for example.

Similarly, the target temperature for pre-heating the coil will vary, depending upon the temperature of the coil during actual processing. Suitable target temperatures for many sputtering applications may range from 400 to 500° C., for example.

After a pre-heating process is conducted in accordance with the present invention, the coil temperature will not have to gradually increase to equilibrium temperature during ensuing sputter deposition processes. By avoiding such gradual temperature increases, the problems associated with radiating energy during the temperature ramp, which adversely affects the deposited film properties, are avoided.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. In a method for delivering ionized material to a workpiece within a processing chamber, which method includes applying RF current to a coil within said chamber to generate an RF field which produces a plasma, application of said RF current to said coil being effective to raise the temperature of said coil, the improvement comprising: before producing said plasma, resistively heating said coil to raise the temperature of said coil while preventing the production of a plasma.

2. The method of claim 1 wherein said step of resistive heating raises the temperature of said coil to be within the range of 400–500° C. prior to production of said plasma.

3. In a method for delivering ionized material to a workpiece within a processing chamber, which method includes applying RF current to a coil within said chamber to generate an RF field which produces a plasma, application of said RF current to said coil being effective to establish an equilibrium temperature in said coil, the improvement comprising: before producing said plasma, resistively heating said coil to bring said coil substantially to said equilibrium temperature while preventing the production of a plasma.

4. The method of claim 3 wherein said step of resistive heating is performed for a predetermined period of time.

5. The method of claim 3 wherein said equilibrium temperature is in the range of 400–500° C.

6. The method of claim 4 wherein said step of resistive heating comprises supplying DC current to said coil.

7. The method of claim 4 wherein said step of resistive heating comprises supplying ac current to said coil, said ac current being at a frequency which is lower than a frequency capable of igniting a plasma in said processing chamber.

8. The method of claim 4 wherein said step of resistive heating comprises supplying ac current to said coil, said ac current being at a frequency capable of igniting a plasma and further comprising maintaining a pressure within said process chamber lower than a pressure which enables ignition of a plasma.

9. The method of claim 3 wherein said step of resistive heating is performed to heat said coil to a temperature above said equilibrium temperature at which said coil begins to emit infrared radiation.

10. The method of claim 9 wherein said step of resistive heating comprises supplying DC current to said coil.

11. The method of claim 9 wherein said step of resistive heating comprises supplying ac current to said coil, said ac current being at a frequency which is lower than a frequency capable of igniting a plasma in said processing chamber.

12. The method of claim 9 wherein said step of resistive heating comprises supplying ac current to said coil, said ac current being at a frequency capable of igniting a plasma and further comprising maintaining a pressure within said process chamber lower than a pressure which enables ignition of a plasma.

13. The method of claim 3 further comprising igniting a plasma and applying a DC bias to a sputtering target in said processing chamber after completion of said step of resistive heating.

14. The method of claim 13 wherein said step of resistive heating comprises operating a switch to supply DC current from a source to said coil and said step of applying a DC bias comprises operating said switch to supply DC current from said source to said sputtering target.

15. An apparatus for delivering ions to a workpiece, comprising:
a vacuum chamber;
a coil disposed within said vacuum chamber, said coil having a resistance;
a source coupled to said coil and adapted to apply a first current to said coil to preheat said coil in the absence of a plasma in said chamber, wherein said coil is preheated by resistance to said current and wherein said first current is one of direct current and alternating current at a frequency below a minimum frequency necessary to maintain plasma in said chamber; and
an RF source coupled to said coil and adapted to apply a second current to said coil to generate a plasma in said chamber, said second current being at an RF frequency equal to or greater than said minimum frequency.

16. An apparatus for delivering ions to a workpiece, comprising:
a vacuum chamber having an interior and an ionization gas inlet adapted to provide ionization gas to said chamber interior at a selected one of a first pressure and a second pressure, wherein said first pressure is below the minimum pressure at which a plasma may be struck in said chamber and said second pressure is at or above said minimum pressure at which a plasma may be struck in said chamber;
an RF coil disposed within said vacuum chamber interior, said coil having a resistance; and
an RF source coupled to said coil and adapted to apply an RF current to said coil prior to striking a plasma while said chamber interior is at said first pressure and subsequently at said second pressure during production of a plasma, wherein said RF coil is resistively heated by said RF current in the absence of a plasma when said chamber interior is at said first pressure and wherein a plasma is struck in said ionization gas by said RF current when said ionization gas is at said second pressure.

17. In an apparatus for delivering ions to a workpiece within a processing chamber, which apparatus includes a coil within said chamber and means for applying RF current to said coil to generate an RF field which produces a plasma, application of said RF current to said coil being effective to raise the temperature of said coil, the improvement comprising: means for resistively heating said coil, before producing said plasma, to raise the temperature of said coil while preventing the production of a plasma.

18. The apparatus of claim 17 wherein said resistive heating means raises the temperature of said coil to be within the range of 400–500° C. prior to production of said plasma.

19. The apparatus of claim 17 wherein said ions are ionized sputtered material.

20. In an apparatus for delivering ionized material to a workpiece within a processing chamber, which apparatus includes a coil within said chamber and means for applying RF current to said coil to generate an RF field which produces a plasma, application of said RF current to said coil being effective to establish an equilibrium temperature in said coil, the improvement comprising: means for resistively heating said coil, before producing said plasma, to bring said coil substantially to at least said equilibrium temperature while preventing the production of a plasma.

21. The apparatus of claim 20 wherein production of a plasma requires an RF current having a minimum frequency and said means for resistively heating said coil comprise a current source coupled to said coil for supplying said coil with a current at a frequency which is lower than said minimum frequency.

22. The apparatus of claim 21 wherein said means for resistively heating said coil further comprise a timer coupled to said current source for terminating the application of current from said current source to said coil after a predetermined period of time.

23. The apparatus of claim 22 wherein said current source is a DC source.

24. In an apparatus for delivering ionized material to a workpiece within a processing chamber, which apparatus includes a coil within said chamber and means for applying RF current to said coil to generate an RF field which produces a plasma, application of said RF current to said coil being effective to establish an equilibrium temperature in said coil, the improvement comprising: means for resistively heating said coil, before producing said plasma, to bring said coil substantially to at least said equilibrium temperature while preventing the production of a plasma; wherein production of a plasma requires an RF current having a minimum frequency and said means for resistively heating said coil comprise a current source coupled to said coil for supplying said coil with a current at a frequency which is lower than said minimum frequency; wherein said means for resistively heating said coil further comprise a timer coupled to said current source for terminating the application of current from said current source to said coil after a predetermined period of time; and wherein said current source is a DC source, the apparatus further comprising a target and a workpiece support within said processing chamber; and a switch coupled to said current source, said coil, and one of said target and said workpiece support, said switch being switchable between a first switching state for coupling said DC current source to said coil and a second switching state for coupling said DC current source to said one of said target and said workpiece support.

25. The apparatus of claim 22 wherein said current source is an AC source.

26. An apparatus for use with a power source, said apparatus for delivering ions to a workpiece, and comprising:
a vacuum chamber;
a plasma generator adapted to provide a plasma in said chamber when activated, said generator including a coil disposed within said vacuum chamber and positioned to couple RF energy into said chamber; and
a controller adapted to selectively preheat said coil and to activate said plasma generator to provide said plasma, said controller being adapted to couple said power source to said coil to apply a first current to said coil to preheat said coil while said plasma generator remains inactive.

27. The apparatus of claim 26 wherein said first current is one of direct current and alternating current at a frequency below a minimum frequency necessary for said generator to provide a plasma in said chamber.

28. The apparatus of claim 27 wherein said apparatus is also for use with an RF power source, said controller being adapted to couple said RF power source to said coil to apply a second current to said coil to activate said generator to generate a plasma in said chamber, said second current being at an RF frequency equal to or greater than said minimum frequency.

29. The apparatus of claim 26 wherein said controller includes a timer adapted to terminate said preheating of said coil after a predetermined time period.

30. The apparatus of claim 26 further comprising a target adapted to sputter when biased adjacent to a plasma, and a switch coupled to said power source, said switch being responsive to a control signal to switch between a first switching state which couples said power source to said coil to preheat said coil when said plasma generator is inactive, and a second switching state which couples said power source to said target to bias said target in the presence of plasma when said plasma generator is activated.

31. The apparatus of claim 30 wherein said controller includes a timer adapted to provide a control signal to said switch to switch said switch from said first switching state to said second switching state to terminate said preheating of said coil after a predetermined time period.

32. The apparatus of claim 26 further comprising a target adapted to sputter when biased adjacent to a plasma, wherein said controller is adapted to apply power to said target to bias said target when said plasma generator is activated and to delay application of power to said target while said coil is being preheated and said plasma generator is inactive.

33. The apparatus of claim 26 further comprising a workpiece support adapted to apply a bias to a workpiece, wherein said controller is adapted to apply power to said workpiece support to bias said workpiece when said plasma generator is activated and to delay application of power to said workpiece support while said coil is being preheated and said plasma generator is inactive.

34. The apparatus of claim 26 wherein said vacuum chamber has an interior and said apparatus is for use with an ionization gas source adapted to provide ionization gas to said chamber interior, said controller being adapted to control said gas source to provide ionization gas to said chamber interior at a selected one of a first pressure while preheating said coil, and a second pressure while said plasma generator is activated, wherein said first pressure is below the minimum pressure at which a plasma may be struck in said chamber and said second pressure is at or above said minimum pressure at which a plasma may be struck in said chamber.

35. The apparatus of claim 34 wherein said power source is an RF power source.

36. The apparatus of claim 35 wherein the frequency of operation of said RF power source is at least 2 Mhz.

37. The apparatus of claim 36 wherein said minimum pressure is at least 10 mTorr.

38. The apparatus of claim 27 wherein said minimum frequency is at least 2 Mhz.

39. The apparatus of claim 28 wherein said minimum frequency is at least 2 Mhz.

40. The apparatus of claim 39 wherein said vacuum chamber has an interior and said apparatus is for use with an ionization gas source adapted to provide ionization gas to said chamber interior, said controller being adapted to control said gas source to provide ionization gas to said chamber interior at a minimum pressure of at least 10 mTorr while said coil is being preheated and while said plasma generator is activated.

41. The apparatus of claim 29 wherein said predetermined time period is at least 3 minutes.

42. The apparatus of claim 41 wherein said predetermined time period is less than 7 minutes.

43. The apparatus of claim 26 wherein said controller is adapted to terminate said coil preheating and to activate said plasma generator when said coil reaches a temperature of at least 400 degrees Centrigrade.

* * * * *